(12) United States Patent
Li

(10) Patent No.: US 11,005,069 B2
(45) Date of Patent: May 11, 2021

(54) DISPLAY PANEL AND DISPLAY DEVICE

(71) Applicant: Wuhan China Star Optoelectronics Semiconductor Display Technology Co., Ltd., Wuhan (CN)

(72) Inventor: Wu Li, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 13 days.

(21) Appl. No.: 16/603,840

(22) PCT Filed: Feb. 20, 2019

(86) PCT No.: PCT/CN2019/075515
§ 371 (c)(1),
(2) Date: Oct. 9, 2019

(87) PCT Pub. No.: WO2020/118893
PCT Pub. Date: Jun. 18, 2020

(65) Prior Publication Data
US 2020/0280020 A1    Sep. 3, 2020

(30) Foreign Application Priority Data

Dec. 12, 2018 (CN) .......................... 201811521108.X

(51) Int. Cl.
*H01L 51/52* (2006.01)
(52) U.S. Cl.
CPC ...... *H01L 51/5253* (2013.01); *H01L 51/5246* (2013.01); *H01L 2251/5338* (2013.01)

(58) Field of Classification Search
CPC ............. H01L 51/5253; H01L 51/5246; H01L 2251/5338; G09F 9/33
See application file for complete search history.

(56) References Cited

U.S. PATENT DOCUMENTS

| 2007/0285337 A1 | 12/2007 | Maddock |
| 2017/0025640 A1 | 1/2017 | Kim et al. |
| 2017/0199544 A1 | 7/2017 | Choi et al. |
| 2017/0294609 A1* | 10/2017 | Namkung ........... H01L 27/3244 |

(Continued)

FOREIGN PATENT DOCUMENTS

| CN | 107799550 | 3/2018 |
| CN | 108281387 | 7/2018 |

(Continued)

*Primary Examiner* — Kyoung Lee

(57) ABSTRACT

The present embodiment provides a display panel and a display device including a display section and a non-display section wherein the display section is disposed on the non-display section and the non-display section includes a first non-bending area, a bending area, and a second non-bending area; a backplate structure including a first backplate and a second backplate, wherein the first backplate is disposed corresponding to the first non-bending area and the second backplate is disposed corresponding to the second non-bending area; wherein a protection structure is disposed at an end of the backplate structure close to the bending area, and the protection structure is configured to make ends of both the first backplate and the second backplate close to the bending area to be in a same section when bending the non-display area.

17 Claims, 4 Drawing Sheets

(56) References Cited

U.S. PATENT DOCUMENTS

2018/0062090 A1    3/2018  Kim et al.
2019/0191543 A1*  6/2019  Han .................. H05K 1/118

FOREIGN PATENT DOCUMENTS

| CN | 207800055 | 8/2018 |
|----|-----------|--------|
| CN | 108766246 | 11/2018 |
| KR | 2017-0084416 | 7/2017 |

* cited by examiner

DISPLAY PANEL AND DISPLAY DEVICE

RELATED APPLICATIONS

This application is a National Phase of PCT Patent Application No. PCT/CN2019/075515 having International filing date of Feb. 20, 2019, which claims the benefit of priority of Chinese Patent Application No. 201811521108.X filed on Dec. 12, 2018. The contents of the above applications are all incorporated by reference as if fully set forth herein in their entirety.

FIELD AND BACKGROUND OF THE INVENTION

The present disclosure relates to the field of display technology, and more particularly to a display panel and a display device.

In recent years, organic light-emitting diodes (OLEDs) have aroused interest of research community and industry, and are considered to be a promising next-generation display technology for that the OLEDs have many excellent characteristics, such as self-illumination, lower power consumption, wide viewing angles, rich color, fast response times, and flexible screen abilities.

In present technology, non-display areas of the OLEDs can be bent to be hidden under display areas. In order to achieve a larger screen ratio, it is necessary to continually reduce a bending radius of a bending area, which requires a backplate (BP) to have high bending precision when bending. However, existing solutions (mainly by adopting segmented attachment) cannot improve corresponding accuracy better, thereby causing damages to lines of the bending area.

Therefore, the existing technology has drawbacks and needs urgently to be improved.

SUMMARY OF THE INVENTION

The present disclosure provides a display panel and a display device, which can improve a bending accuracy when bending the backplate, thereby reducing damages to lines of a bending area.

The present disclosure provides a display panel including:

a display section and a non-display section wherein the display section is disposed on the non-display section and the non-display section comprises a first non-bending area, a bending area, and a second non-bending area;

a backplate structure comprising a first backplate and a second backplate, wherein the first backplate is disposed corresponding to the first non-bending area and the second backplate is disposed corresponding to the second non-bending area;

wherein a protection structure is disposed at an end of the backplate structure close to the bending area, and the protection structure is configured to make ends of both the first backplate and the second backplate close to the bending area be in a same cross section when bending the non-display area.

According to the present disclosure, the protection structure includes a first protection area and a second protection area, the first protection area disposed on the second protection area, a vertical thickness of the first protection area equal to a vertical thickness of the first backplate or equal to a vertical thickness of the second backplate.

According to the present disclosure, a horizontal width of the first protection area is greater than 0 and less than or equal to 50 microns, and a vertical thickness of the second protection area ranges from 0 to 50 microns.

According to the present disclosure, a shape of the protection structure formed by connecting the first protection area to the second protection area is L-shaped to make the protection structure against the backplate structure.

According to the present disclosure, a vertical thickness of the protection structure is smaller than a vertical thickness of the first backplate or a vertical thickness of the second backplate, and the vertical thickness of the protection structure ranges from 25 and 2000 microns.

According to the present disclosure, a shape of the protection structure includes any one of a trapezoid and a rectangle.

According to the present disclosure, a pad and a reinforcing member are disposed between the first backplate and the second backplate, and the reinforcing member is disposed on the second backplate, and the pad is disposed on the reinforcing member.

According to the present disclosure, vertical thicknesses of both the first backplate and the second backplate range from 25 to 2000 microns, and a vertical thickness of non-display section ranges from 3 to 50 microns.

According to the present disclosure, a glue layer is disposed between the backplate structure and the non-display section, and the glue layer is configured to bond the non-display section and the backplate structure.

The present disclosure provides a display device, including a shell and a display panel disposed on the shell, wherein the display panel including:

a display section and a non-display section wherein the display section is disposed on the non-display section and the non-display section includes a first non-bending area, a bending area, and a second non-bending area;

a backplate structure including a first backplate and a second backplate, wherein the first backplate is disposed corresponding to the first non-bending area and the second backplate is disposed corresponding to the second non-bending area;

wherein a protection structure is disposed at an end of the backplate structure close to the bending area, and the protection structure is configured to make ends of both the first backplate and the second backplate close to the bending area be in a same cross section when bending the non-display area.

According to the present disclosure, the protection structure includes a first protection area and a second protection area, the first protection area disposed on the second protection area, a vertical thickness of the first protection area equal to a vertical thickness of the first backplate or equal to a vertical thickness of the second backplate.

According to the present disclosure, a horizontal width of the first protection area is greater than 0 and less than or equal to 50 microns, and a vertical thickness of the second protection area ranges from 0 to 50 microns.

According to the present disclosure, a shape of the protection structure formed by connecting the first protection area to the second protection area is L-shaped to make the protection structure against the backplate structure.

According to the present disclosure, wherein a vertical thickness of the protection structure is smaller than a vertical thickness of the first backplate or a vertical thickness of the second backplate, and the vertical thickness of the protection structure ranges from 25 and 2000 microns.

According to the present disclosure, wherein a shape of the protection structure includes any one of a trapezoid and a rectangle.

According to the present disclosure, a pad and a reinforcing member are disposed between the first backplate and the second backplate, and the reinforcing member is disposed on the second backplate, and the pad is disposed on the reinforcing member.

According to the present disclosure, vertical thicknesses of both the first backplate and the second backplate range from 25 to 2000 microns, and a vertical thickness of non-display section ranges from 3 to 50 microns.

According to the present disclosure, a glue layer is disposed between the backplate structure and the non-display section, and the glue layer is configured to bond the non-display section and the backplate structure.

The present disclosure provides a display panel including: a display section and a non-display section wherein the display section is disposed on the non-display section and the non-display section includes a first non-bending area, a bending area, and a second non-bending area;

a backplate structure including a first backplate and a second backplate, wherein the first backplate is disposed corresponding to the first non-bending area and the second backplate is disposed corresponding to the second non-bending area;

wherein a protection structure is disposed at an end of the backplate structure close to the bending area, and the protection structure is configured to make ends of both the first backplate and the second backplate close to the bending area be in a same section when bending the non-display area;

Wherein the protection structure includes a first protection area and a second protection area, the first protection area disposed on the second protection area, a vertical thickness of the first protection area equal to a vertical thickness of the first backplate or equal to a vertical thickness of the second backplate;

wherein a glue layer is disposed between the backplate structure and the non-display section, and the glue layer is configured to bond the non-display section and the backplate structure.

The present disclosure provides a display panel including: a display section and a non-display section wherein the display section is disposed on the non-display section and the non-display section comprises a first non-bending area, a bending area, and a second non-bending area; a backplate structure comprising a first backplate and a second backplate, wherein the first backplate is disposed corresponding to the first non-bending area and the second backplate is disposed corresponding to the second non-bending area; wherein a protection structure is disposed at an end of the backplate structure close to the bending area, and the protection structure is configured to make ends of both the first backplate and the second backplate close to the bending area be in a same cross section when bending the non-display area, thereby improving a bending accuracy when bending the backplates, and reducing damages in lines of the bending area.

BRIEF DESCRIPTION OF THE SEVERAL VIEWS OF THE DRAWINGS

Aforementioned contents of the present disclosure will be a better understood with reference to the following description, appended claims and accompanying figures. Apparently, the drawings described below merely represent some embodiments of the present disclosure, and other drawings may be obtained according to these drawings by those skilled in the art without creative labor.

DESCRIPTION OF SPECIFIC EMBODIMENTS OF THE INVENTION

Technical solution in embodiments of the present disclosure will be described clearly and completely with reference to accompanying drawings in the embodiments of the present disclosure. The embodiments described herein are part of the embodiments of the present disclosure rather than all of them. Based on the embodiments of the present disclosure, other embodiments obtained by those skilled in the art on the premise of paying no creative efforts belong to the protection scope of the present disclosure.

In present technology, a backplate is divided into two sections attached under a non-display area of organic light-emitting diodes (OLEDs), and two sections are disposed on two ends of a bending area in the non-display area when bending the non-display area of the OLEDs. However, ends of the two sections close to the bending area are often not in a same cross section when bending the non-display area of the OLEDS. And the two sections protrude outward at a certain angle, making edges of the two sections to bear uneven force, thereby causing damages to lines in the bending area.

Figure 1:
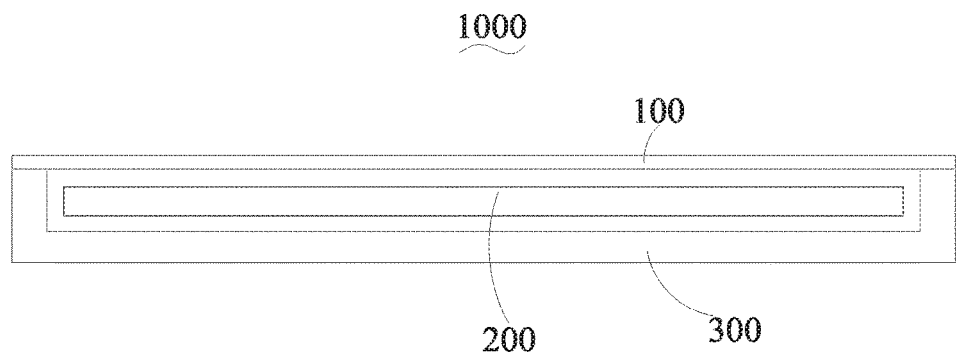
FIG. 1 is a structural schematic diagram of a display device according to the present disclosure.

Please referring to FIG. 1, FIG. 1 is a structural schematic diagram of a display device 1000 according to the present disclosure. The display device 1000 can include a display panel 100, a control circuitry 200, and a shell 300. It can be noted that the display device shown in FIG. 1 is not limit to above, and can further include other devices, such as a camera, an antenna structure, a fingerprint module, and so on.

Wherein the display panel 100 is disposed on the shell 300. According to some embodiments, the display panel 100 can be fixed on the shell 300. The display panel 100 and the shell 300 can form a closed space to accommodate the control circuitry 200 and other devices. According to some embodiments, the shell 300 can be made of flexible materials, such as plastics, silicone or other flexible materials.

Wherein the control circuitry 200 is installed in the shell 300. The control circuit 200 can be a main board of the display device 1000. The control circuit 200 can be integrated with one, two or more of a functional component consisting of a battery, an antenna structure, a microphone, a loudspeaker, a headphone interface, a universal serial bus, a camera, a distance sensor, an ambient light sensor, a receiver, and a processor.

Wherein the display panel 100 is installed in the shell 300. At the same time, the display panel 100 is electrically connected to the control circuitry 200 to form a display surface of the display device 1000. The display panel 100 can include a display area and a non-display area. The display area can be used to display a screen of the display device 1000 or for a user to perform touch control or the like. The non-display area can be used to dispose various functional components.

Figure 2:
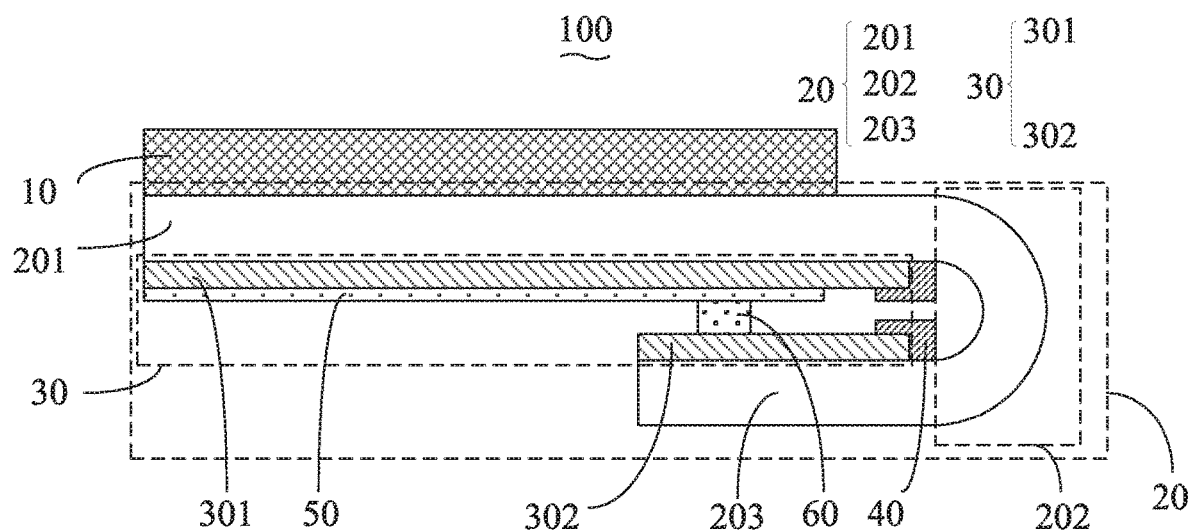
FIG. 2 is a structural schematic diagram of a display panel according to the present disclosure.

Please referring to FIG. 2, FIG. 2 is a structural schematic diagram of a display panel according to the present embodiment. The display panel 100 includes a display section 10 and a non-display section 20 wherein the display section 10 is disposed on the non-display section 20 and the non-display section 20 includes a first non-bending area 201, a bending area 202, and a second non-bending area 20; a backplate structure 30 including a first backplate 301 and a second backplate 302, wherein the first backplate 301 is disposed corresponding to the first non-bending area 201 and the second backplate 302 is disposed corresponding to the second non-bending area 203; wherein a protection structure 40 is disposed at an end of the backplate structure 30 close to the bending area 202, and the protection structure 40 is configured to make ends of both the first backplate 301 and the second backplate 302 close to the bending area 202 to be in a same cross section when bending the non-display area 20.

It can be noted that the non-display section 20 is divided into three sections. A first section is the first non-bending area 201. A second section is the bending area 202. A third section is the second non-bending area 203. The first non-bending area 201 is disposed under the display section 10. The bending area 202 is disposed between the first non-bending area 201 and the second non-bending area 203. The second non-bending area 203 is disposed under the first non-bending area 201 by bending the bending area 202.

Wherein the backplate structure 30 includes the first backplate 301 and the second backplate 302. The first backplate 301 fits the first non-bending area 201, and a horizontal length of the first backplate 301 is not greater than a horizontal length of the first non-bending area 201. The second backplate 302 fits the second non-bending area 203, and a horizontal length of the second backplate 302 is not greater than a horizontal length of the second non-bending area 203.

A protection structure 40 is disposed at ends of both the first backplate 301 and the second backplate 301 close to the bending area 202. The protection structure 40 is configured to separate the first non-bending area 201, the second non-bending area 203, and the bending area 202 when bending the non-display section 20. Further, ends of both the first backplate 301 and the second backplate 302 close to the bending area 202 can be ensured to be in a same cross section, and circuits disposed on the bending area 202 can be protected when bending the non-display area.

The display panel 100, according the present embodiment, includes the display section 10 and the non-display section 20 wherein the display section 10 is disposed on the non-display section 20 and the non-display section 20 includes the first non-bending area 201, the bending area 202 and the second non-bending area 20; the backplate structure 30 including the first backplate 301 and the second backplate 302, wherein the first backplate 301 is disposed corresponding to the first non-bending area 201 and the second backplate 302 is disposed corresponding to the second non-bending area 203; wherein the protection structure 40 is disposed at an end of the backplate structure 30 close to the bending area 202, and the protection structure 40 is configured to make ends of both the first backplate 301 and the second backplate 302 close to the bending area 202 to be in a same cross section when bending the non-display area 20, thereby improving bending accuracy when bending the backplates, and reducing damages in lines of the bending area.

According to some embodiments, constituent materials of the protection structure 40 include but not limited to photosensitive adhesive.

According to some embodiments, a pad 50 and a reinforcing member 60 are disposed between the first backplate 301 and the second backplate 302, and the reinforcing member 60 is disposed on the second backplate 302, and the pad 50 is disposed on the reinforcing member 60. The reinforcing member 60 is configured to reinforce stability of the display panel 100.

Figure 3:
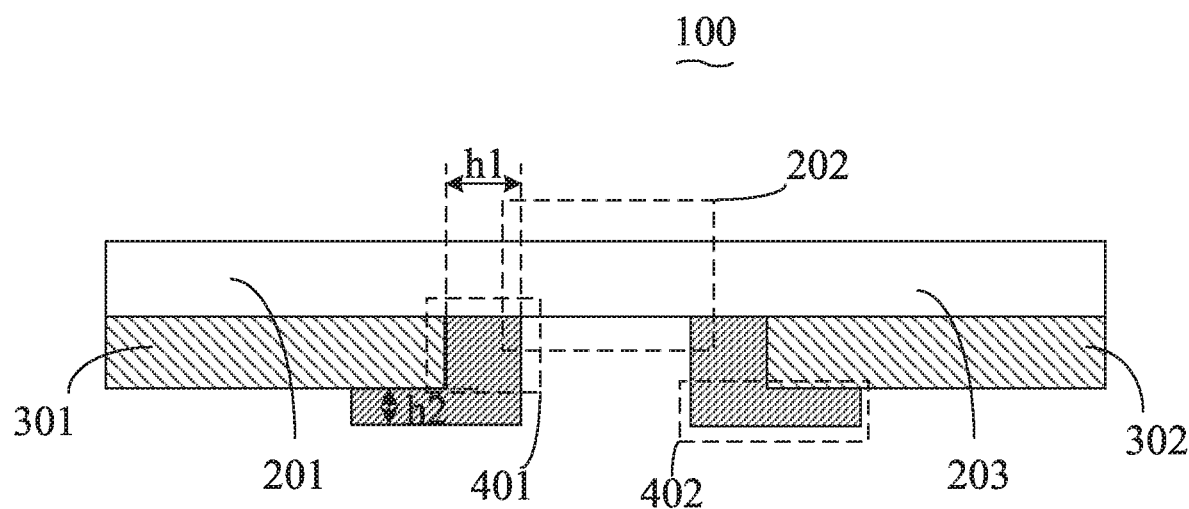
FIG. 3 is a first partial enlargement of a display panel according to the present disclosure.

According to some embodiments, as shown in FIG. 3, FIG. 3 is a first partial enlargement of the display panel according to the present embodiment. FIG. 3 is the partial enlargement of the display panel 100 before bending. Wherein the protection structure 40 includes a first protection area 401 and a second protection area 402. The first protection area 401 is disposed on the second protection area 402. A vertical thickness of the first protection area 401 equal to a vertical thickness of the first backplate 301 or equal to a vertical thickness of the second backplate 302.

Specifically, the protection structure 40 includes the first protection area 401 and the second protection area 402. The first protection area 401 is disposed on a side of the first backplate 301 close to the bending area 202 and on a side of the second backplate 302 close to the bending area 202. The first protection area 401 is disposed on the second protection area 402 and is overlapped on the first backplate 301 and the second backplate 302.

According to some embodiments, a horizontal width h1 of the first protection area 401 is greater than 0 and less than or equal to 50 microns, and a vertical thickness h2 of the second protection area 402 ranges from 0 to 50 microns.

According to some embodiments, a shape of the protection structure 40 formed by connecting the first protection area 401 to the second protection area 402 is L-shaped to make the protection structure 40 against the backplate structure 30.

Figure 4:
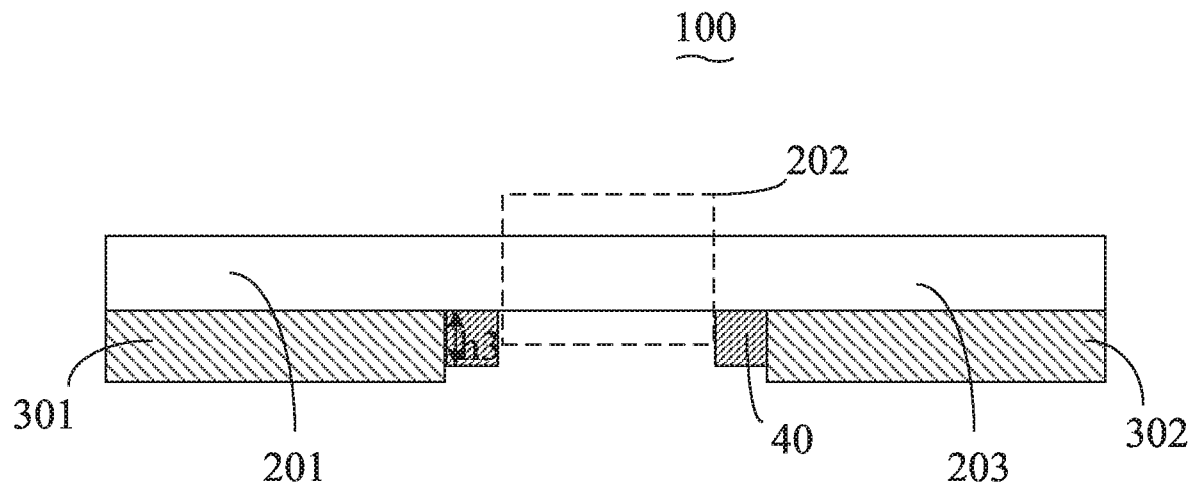
FIG. 4 is a second partial enlargement of a display panel according to the present disclosure.

According to some embodiments, as shown in FIG. 4, FIG. 4 is a second partial enlargement of the display panel according to the present embodiment. Wherein a vertical thickness of the protection structure 40 is smaller than a vertical thickness of the first backplate 301 or a vertical thickness of the second backplate 302. The vertical thickness h3 of the protection structure 40 ranges from 25 and 2000 microns. Wherein the vertical thickness h3 of the protection structure 40 ranges from 25 and 2500 micron when the vertical thickness h3 of the protection structure 40 is smaller than the vertical thickness of the first backplate 301 or the vertical thickness of the second backplate 302.

Figure 5:
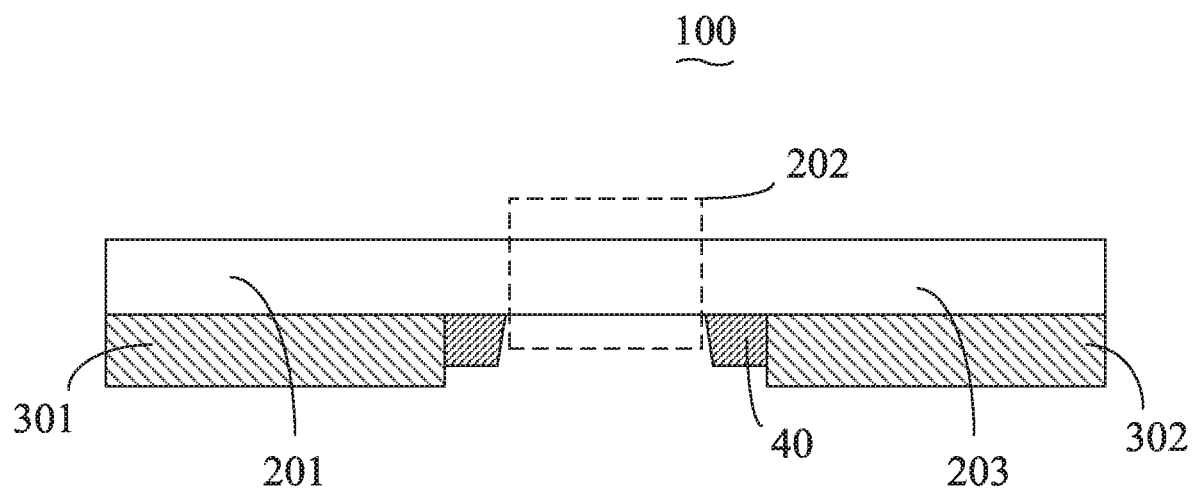
FIG. 5 is a third partial enlargement of a display panel according to the present disclosure.

According to some embodiments, as shown in FIG. 5, FIG. 5 is a third partial enlargement of the display panel according to the present embodiment. The shape of the protection structure 40 includes any one of a trapezoid and a rectangle.

According to some embodiments, vertical thicknesses of both the first backplate 301 and the second backplate 302 range from 25 to 2000 microns, and a vertical thickness of non-display section 20 ranges from 3 to 50 microns.

Figure 6:
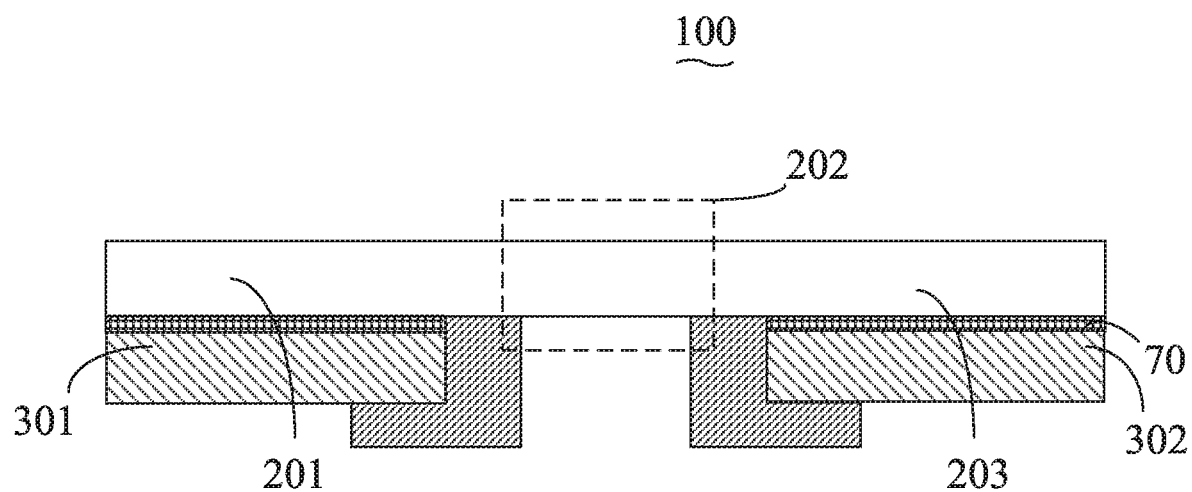
FIG. 6 is a fourth partial enlargement of a display panel according to the present disclosure.

According to some embodiments, as shown in FIG. 6, FIG. 6 is a fourth partial enlargement of the display panel according to the present embodiment. A glue layer 70 is disposed between the backplate structure 30 and the non-display section 20, and the glue layer 70 is configured to bond the non-display section 20 and the backplate structure 30.

Specifically, constituent materials of the backplate structure 30 include but not limited to polyethylene terephthalate and polyethylene. Constituent materials of the glue layer 70 include but not limited to acrylic and silicone. A stickiness of the glue layer 70 generally ranges from 200 to 2500 kgf·N/25 mm.

The display panel 100, according the present embodiment, includes the display section 10 and the non-display section 20 wherein the display section 10 is disposed on the non-display section 20 and the non-display section 20 includes the first non-bending area 201, the bending area 202, and the second non-bending area 20; the backplate structure 30 including the first backplate 301 and the second backplate 302, wherein the first backplate 301 is disposed corresponding to the first non-bending area 201 and the second backplate 302 is disposed corresponding to the second non-bending area 203; wherein the protection structure 40 is disposed at an end of the backplate structure 30 close to the bending area 202, and the protection structure 40 is configured to make ends of both the first backplate 301 and the second backplate 302 close to the bending area 202 be in a same cross section when bending the non-display area 20, thereby improving bending accuracy when bending the backplates, and reducing damages to lines of the bending area.

According to the present embodiment, the display panel includes the display section and the non-display section wherein the display section is disposed on the non-display section and the non-display section includes the first non-bending area, the bending area and the second non-bending area; the backplate structure including the first backplate and the second backplate, wherein the first backplate is disposed corresponding to the first non-bending area and the second backplate is disposed corresponding to the second non-bending area; wherein the protection structure is disposed at the end of the backplate structure close to the bending area, and the protection structure is configured to make ends of both the first backplate and the second backplate close to the bending area be in a same cross section when bending the non-display area; wherein the protection structure includes the first protection area and the second protection area, the first protection area disposed on the second protection area, a vertical thickness of the first protection area equal to a vertical thickness of the first backplate or equal to a vertical thickness of the second backplate; wherein the glue layer is disposed between the backplate structure and the non-display section, and the glue layer is configured to bond the non-display section and the backplate structure.

Figure 7:
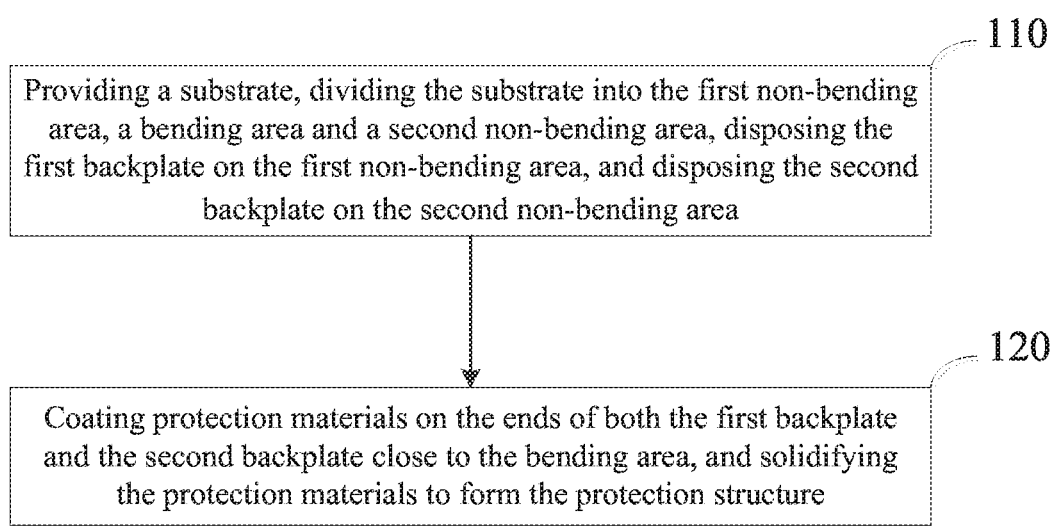
FIG. 7 is a flow diagram of a method for manufacturing a display panel according to the present disclosure.

A manufacturing method of the display panel to manufacture the display panel as described above is provided, according to the present embodiment. Please referring to FIG. 7, FIG. 7 is a flow diagram of the manufacturing method of the display panel according to the present embodiment. The manufacturing method of the display panel includes following steps:

S101. Providing a substrate, dividing the substrate into the first non-bending area, a bending area, and a second non-bending area, disposing the first backplate on the first non-bending area, and disposing the second backplate on the second non-bending area.

S102. Coating protection materials on the ends of both the first backplate and the second backplate close to the bending area, and solidifying the protection materials to form the protection structure.

In the foregoing implementations, the description of each implementation has its own emphasis. For the parts that are not described in detail in one implementation, reference may be made to related descriptions in other implementations.

The display panel, the manufacturing method of the display panel, and the display device, according to the present embodiment, are described in detail above. Embodiments of the present embodiment have been described in detail, and principles and embodiments of the present embodiment have been elaborated with reference to specific examples, but the description of the above embodiments is merely used to assist in understanding the present embodiment and its core idea. It should be understood by those skilled in the art that, the technical solutions described in the implementations can be modified, or equivalent replacements can be made to some of the technical features in the implementations, and these modifications or replacements do not make the essence of the corresponding technical solutions depart from the scope of the technical solutions in the implementations of the present embodiment.

What is claimed is:

1. A display panel, comprising:
a display section and a non-display section wherein the display section is disposed on the non-display section and the non-display section comprises a first non-bending area, a bending area, and a second non-bending area;
a backplate structure comprising a first backplate and a second backplate, wherein the first backplate is disposed corresponding to the first non-bending area and the second backplate is disposed corresponding to the second non-bending area;
wherein a protection structure is disposed at an end of the backplate structure close to the bending area, and the protection structure is configured to make ends of both the first backplate and the second backplate close to the bending area to be in a same cross section when bending the non-display area; and
wherein a pad and a reinforcing member are disposed between the first backplate and the second backplate, and the reinforcing member is disposed on the second backplate, and the pad is disposed on the reinforcing member.

2. The display panel as claimed in claim 1, wherein the protection structure comprises a first protection area and a second protection area, the first protection area disposed on the second protection area, a vertical thickness of the first protection area equal to a vertical thickness of the first backplate or equal to a vertical thickness of the second backplate.

3. The display panel as claimed in claim 2, wherein a horizontal width of the first protection area is greater than 0 and less than or equal to 50 microns, and a vertical thickness of the second protection area ranges from 0 to 50 microns.

4. The display panel as claimed in claim 2, wherein a shape of the protection structure formed by connecting the first protection area to the second protection area is L-shaped to make the protection structure against the backplate structure.

5. The display panel as claimed in claim 1, wherein a vertical thickness of the protection structure is smaller than a vertical thickness of the first backplate or a vertical thickness of the second backplate, and the vertical thickness of the protection structure ranges from 25 and 2000 microns.

6. The display panel as claimed in claim 5, wherein a shape of the protection structure comprises any one of a trapezoid and a rectangle.

7. The display panel as claimed in claim 1, wherein vertical thicknesses of both the first backplate and the second backplate range from 25 to 2000 microns, and a vertical thickness of non-display section ranges from 3 to 50 microns.

8. The display panel as claimed in claim 1, wherein a glue layer is disposed between the backplate structure and the non-display section, and the glue layer is configured to bond the non-display section and the backplate structure.

9. A display device, comprising a shell and a display panel disposed on the shell, wherein the display panel comprising:
   a display section and a non-display section wherein the display section is disposed on the non-display section and the non-display section comprises a first non-bending area, a bending area, and a second non-bending area;
   a backplate structure comprising a first backplate and a second backplate, wherein the first backplate is disposed corresponding to the first non-bending area and the second backplate is disposed corresponding to the second non-bending area;
   wherein a protection structure is disposed at an end of the backplate structure close to the bending area, and the protection structure is configured to make ends of both the first backplate and the second backplate close to the bending area to be in a same cross section when bending the non-display area; and
   wherein a pad and a reinforcing member are disposed between the first backplate and the second backplate, and the reinforcing member is disposed on the second backplate, and the pad is disposed on the reinforcing member.

10. The display device as claimed in claim 9, wherein the protection structure comprises a first protection area and a second protection area, the first protection area disposed on the second protection area, a vertical thickness of the first protection area equal to a vertical thickness of the first backplate or equal to a vertical thickness of the second backplate.

11. The display device as claimed in claim 10, wherein a horizontal width of the first protection area is greater than 0 and less than or equal to 50 microns, and a vertical thickness of the second protection area ranges from 0 to 50 microns.

12. The display device as claimed in claim 10, wherein a shape of the protection structure formed by connecting the first protection area to the second protection area is L-shaped to make the protection structure against the backplate structure.

13. The display device as claimed in claim 9, wherein a vertical thickness of the protection structure is smaller than a vertical thickness of the first backplate or a vertical thickness of the second backplate, and the vertical thickness of the protection structure ranges from 25 and 2000 microns.

14. The display device as claimed in claim 13, wherein a shape of the protection structure comprises any one of a trapezoid and a rectangle.

15. The display device as claimed in claim 9, wherein vertical thicknesses of both the first backplate and the second backplate range from 25 to 2000 microns, and a vertical thickness of non-display section ranges from 3 to 50 microns.

16. The display device as claimed in claim 9, wherein a glue layer is disposed between the backplate structure and the non-display section, and the glue layer is configured to bond the non-display section and the backplate structure.

17. A display panel comprising:
   a display section and a non-display section wherein the display section is disposed on the non-display section and the non-display section comprises a first non-bending area, a bending area, and a second non-bending area;
   a backplate structure comprising a first backplate and a second backplate, wherein the first backplate is disposed corresponding to the first non-bending area and the second backplate is disposed corresponding to the second non-bending area;
   wherein a protection structure is disposed at an end of the backplate structure close to the bending area, and the protection structure is configured to make ends of both the first backplate and the second backplate close to the bending area to be in a same section when bending the non-display area;
   wherein the protection structure comprises a first protection area and a second protection area, the first protection area disposed on the second protection area, a vertical thickness of the first protection area equal to a vertical thickness of the first backplate or equal to a vertical thickness of the second backplate;
   wherein a glue layer is disposed between the backplate structure and the non-display section, and the glue layer is configured to bond the non-display section and the backplate structure.

* * * * *